United States Patent
Qiu et al.

(10) Patent No.: US 8,455,312 B2
(45) Date of Patent: Jun. 4, 2013

(54) FABRICATION METHODS FOR T-GATE AND INVERTED L-GATE STRUCTURE FOR HIGH FREQUENCY DEVICES AND CIRCUITS

(76) Inventors: Cindy X. Qiu, Brossard (CA); Ishiang Shih, Brossard (CA); Chunong Qiu, Brossard (CA); Yi-Chi Shih, Palos Verdes Estates, CA (US); Julia Qiu, Brossard (CA)

( * ) Notice: Subject to any disclaimer, the term of this patent is extended or adjusted under 35 U.S.C. 154(b) by 0 days.

(21) Appl. No.: 13/199,816

(22) Filed: Sep. 12, 2011

(65) Prior Publication Data

US 2013/0065383 A1    Mar. 14, 2013

(51) Int. Cl.
*H01L 21/338*    (2006.01)
*H01L 21/44*    (2006.01)

(52) U.S. Cl.
USPC .......................... 438/182; 438/673; 438/671

(58) Field of Classification Search
USPC ........................................... 438/584–670
See application file for complete search history.

(56) References Cited

U.S. PATENT DOCUMENTS

| | | | |
|---|---|---|---|
| 3,918,997 A * | 11/1975 | Mohsen et al. | 438/144 |
| 4,315,984 A * | 2/1982 | Okazaki et al. | 438/670 |
| 4,865,952 A * | 9/1989 | Yoshioka et al. | 430/315 |
| 5,220,186 A * | 6/1993 | Kasai et al. | 257/284 |
| 5,580,701 A * | 12/1996 | Lur et al. | 430/316 |
| 6,042,975 A * | 3/2000 | Burm et al. | 430/22 |
| 6,255,202 B1 * | 7/2001 | Lyons et al. | 438/585 |
| 6,270,929 B1 * | 8/2001 | Lyons et al. | 430/5 |
| 6,313,019 B1 * | 11/2001 | Subramanian et al. | 438/585 |
| 6,326,300 B1 * | 12/2001 | Liu et al. | 438/638 |
| 6,403,456 B1 * | 6/2002 | Plat et al. | 438/579 |
| 7,439,302 B2 * | 10/2008 | Huang et al. | 525/118 |
| 7,501,348 B2 * | 3/2009 | Chen et al. | 438/706 |
| 7,800,132 B2 * | 9/2010 | Smorchkova et al. | 257/194 |
| 8,053,345 B2 * | 11/2011 | Ahn et al. | 438/585 |
| 2008/0214011 A1 * | 9/2008 | Colburn et al. | 438/708 |
| 2008/0251877 A1 * | 10/2008 | Jain et al. | 257/499 |
| 2009/0061543 A1 * | 3/2009 | Ukraintsev | 438/14 |
| 2009/0179234 A1 * | 7/2009 | Maher et al. | 257/256 |
| 2010/0127395 A1 * | 5/2010 | He et al. | 257/752 |
| 2011/0180850 A1 * | 7/2011 | Shih et al. | 257/192 |
| 2013/0026639 A1 * | 1/2013 | Arnold et al. | 257/773 |

* cited by examiner

*Primary Examiner* — Scott B. Geyer
*Assistant Examiner* — Evren Seven (57) ABSTRACT

In high frequency circuits, the switching speed of devices is often limited by the series resistance and capacitance across the input terminals. To reduce the resistance and capacitance, the cross-section of input electrodes is made into a T-shape or inverted L-shape through lithography. The prior art method for the formation of cavities for T-gate or inverted L-gate is achieved through several steps using multiple photomasks. Often, two or even three different photoresists with different sensitivity are required. In one embodiment of the present invention, an optical lithography method for the formation of T-gate or inverted L-gate structures using only one photomask is disclosed. In another embodiment, the structure for the T-gate or inverted L-gate is formed using the same type of photoresist material.

19 Claims, 10 Drawing Sheets

Prior Art

Prior Art

Dose distribution in 2nd photoresist layer

FABRICATION METHODS FOR T-GATE AND INVERTED L-GATE STRUCTURE FOR HIGH FREQUENCY DEVICES AND CIRCUITS

FIELD OF THE INVENTION

This invention relates to the methods for the formation of T-gate or inverted L-gate for a high frequency devices or circuits.

BACKGROUND OF THE INVENTION

Figure 1A:
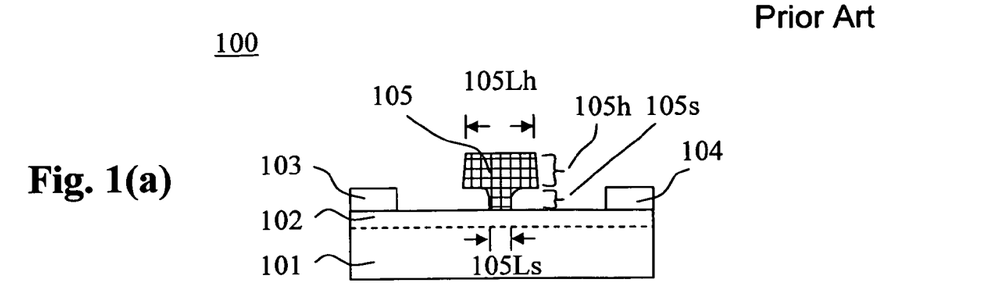
FIG. 1(a)-1(d) shows schematic cross-sectional diagrams of a prior art method for fabrication of a T-gate structure at different stages.

In circuits for high frequency applications, the unwanted series resistance and capacitance across the input terminals of a device must be reduced. One of the high frequency devices is a high electron mobility transistor (HEMT) where input signals are applied between the gate and source. To reduce the series resistance, the cross section of the gate metal should be maintained even when its length is reduced for short channel devices. To reduce the capacitance, the lateral areas of the gate electrode facing the source and drain should be minimized. This is achieved by adopting a two sections gate electrode structure (100) as depicted in FIG. 1(a), which shows a simplified schematic diagram of a HEMT (100) having a substrate (101), a channel layer (102), a source (103), a drain (104) and a gate (105). The gate (105) has a stem portion (105s) and a head portion (105h), the dimension of the stem portion of the gate contacting the channel layer is defined as the gate length or channel length (105Ls) which is made close to 100 nm or smaller in order to achieve high frequency performance. Whereas the head portion length (105Lh) is made substantially larger than the gate length (105Ls) to reduce the resistance of the gate in the direction of perpendicular to the direction of channel length and parallel to the surface of the substrate. Such a gate with the head portion substantially longer than that of the stem portion is often called a T-gate. It may be possible that the head portion is not aligned to the stem portion symmetrically to reduce further the capacitance to the source. Such a gate with the misaligned head portion is often called inverted L-gate.

Figure 1B:
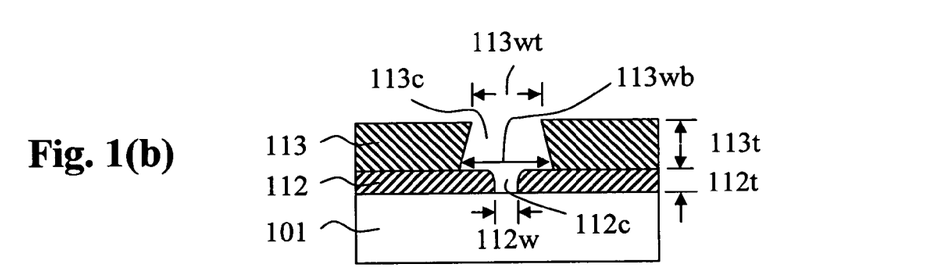
Figure 1C:
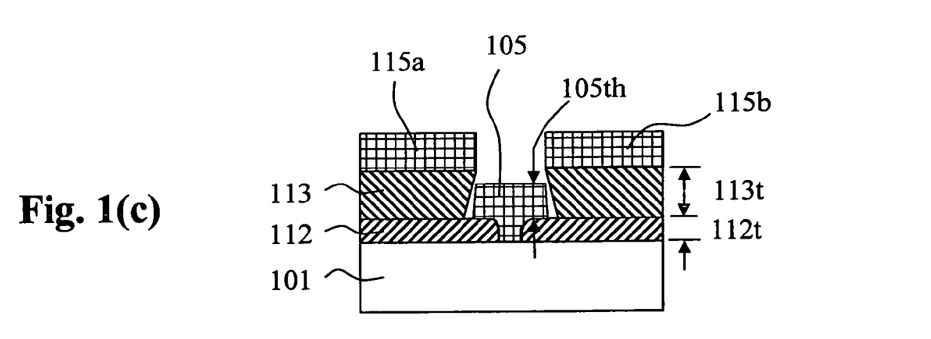
Figure 1D:
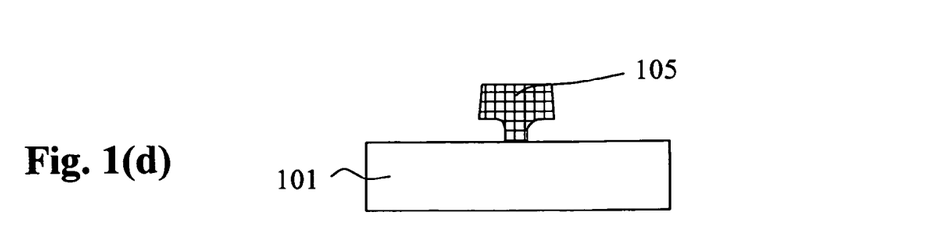

The fabrication of these T-gate or inverted L-gate is normally made by a lift-off process in order to avoid the interaction of etching chemicals with the channel layer on the substrate, which is often based on GaAs and related materials. The lift-off process is depicted in FIG. 1(b)-1(d). To simplify the explanation, the drain, source and channel layer are not shown in these figures. On a semiconductor substrate (101), a first photoresist (or resist) layer (112) with a first resist layer thickness (112t) and a second resist layer (113) having a second resist layer thickness (113t) are applied. Material of the first resist layer is selected to be different from that of the second resist layer to minimize intermixing between these two resist layers. First, the second resist layer (113) is exposed to a second UV light beam through a second photomask pattern and developed to form a second cavity (113c). After a cleaning and drying step, the first resist layer is exposed to a first UV light beam through a first photomask pattern and then developed to form a first cavity (112c) of a width (112w). During the creation of the second cavity (113c), the exposure and developing conditions are selected so that top portion width (113wt) of the second cavity is smaller than the bottom portion width (113wb) to facilitate lift-off after metal layer deposition. As shown in FIG. 1(b), the second cavity widths (113wt and 113wb) is selected to be larger than the first cavity width (112w) in order to form the stem portion and head portion of the gate. After cleaning and drying, the semiconductor substrate (101) with the first resist layer and the second resist layer is loaded into a vacuum chamber to deposit metal layer for forming of the gate (105). Due to the nature of deposition, layer of gate metal (115a, 115b, FIG. 1(c)) is also deposited on the second resist layer (113). Gate thickness (105th) is controlled to be less than the second resist layer thickness (113t) so that there is no connection between the gate (105) and the layer of gate metal (115a, 115b) on the second resist layer. The semiconductor substrate (101) with the first resist layer (112), the second resist layer (113) and the deposited gate (105) and the layer of gate metal (115a, 115b) is immersed in a solvent to dissolve the first resist layer and the second resist layer. The layer of gate metal (115a, 115b) will be detached from the semiconductor substrate. After a cleaning and drying step, the fabrication of the T-gate (105) on the semiconductor substrate (101) as shown in FIG. 1(d) is completed.

Figure 2:
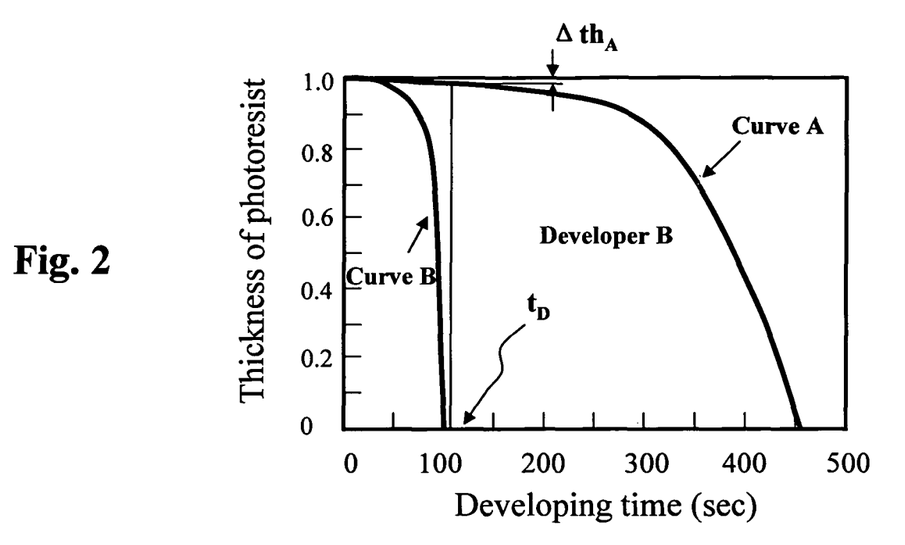
FIG. 2 shows the variation of thicknesses with time for two photoresists (curve A for first resist layer A and curve B for second resist layer B) in a developer B for second resist layer B.

In the above described method, the materials for the first resist layer (112) should have slower developing property compared to that for the second resist layer (113). FIG. 2 shows schematically the developing property of the exposed first resist layer (Curve A) and that of the second resist layer (Curve B) in a developer B used to develop the second resist layer (113). It is noted that the thickness of the second resist layer at $t_D \approx 100$ seconds is effectively zero whereas the decrease in the thickness of the first resist layer, $\Delta th_A$ is almost negligible. Therefore, the second resist layer (113) can be developed without affecting the integrity of the first resist layer (112).

Figure 3A:
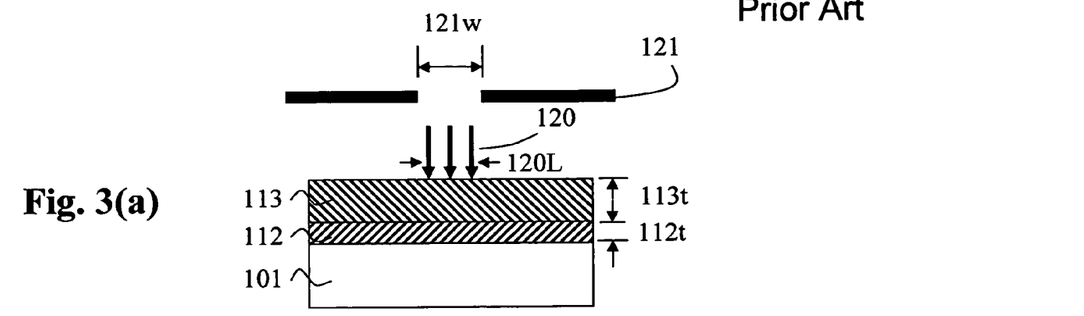
FIG. 3(a)-3(d) illustrates the main prior art processing steps for the formation of cavities for a T-gate structure.
Figure 3B:
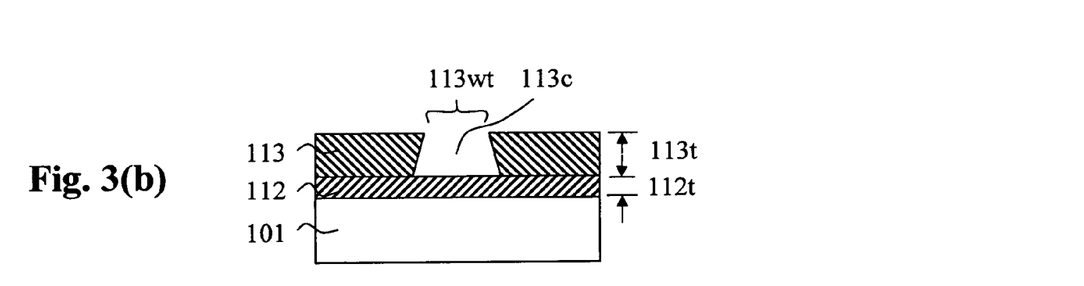
Figure 3C:
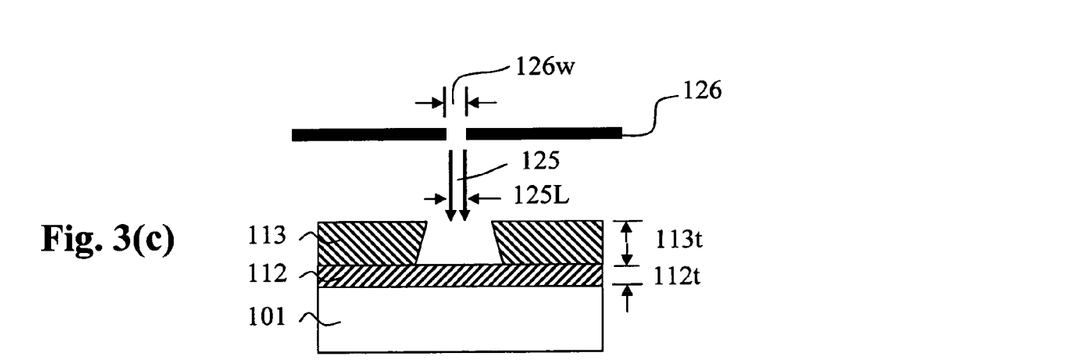
Figure 3D:
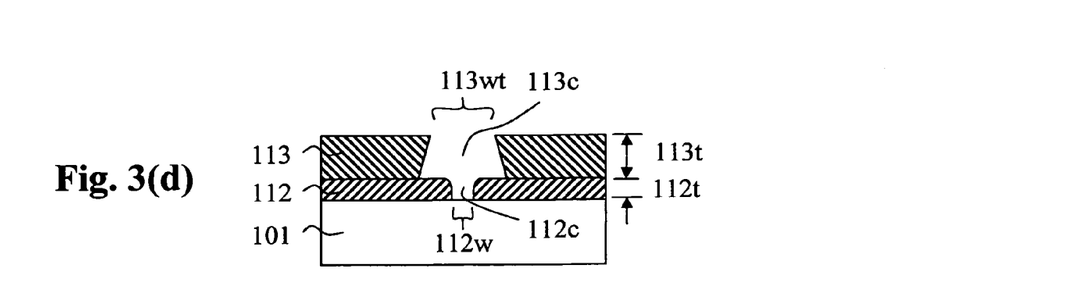

The prior art processing steps involving two separate photomasks are illustrated in FIG. 3(a)-3(d). As depicted in FIG. 3(a), a first resist layer (112) of thickness (112t) is coated on a semiconductor substrate (101) and baked. This is followed by the coating and baking of a second resist layer (113) of thickness (113t). A second light beam (120) having a second light beam length (120L) is illuminated on the second resist layer (113) through a second photomask (121) with a second window of width (121w). After exposure, the semiconductor substrate with the resist layers is immersed in a developer B to develop the second resist layer (113) and to form a second cavity (113c) with a top portion width (113wt), as indicated in FIG. 3(b). After rinsing and drying, a first light beam (125) having a first light beam length (125L), defined by a first photomask (126) with a first window width (126w), is illuminated on the first resist layer (112). After exposure, the semiconductor substrate with the resist layers is developed in a developer A to develop the first resist layer and to form a first cavity (112c) with a first cavity width (112w), as indicated in FIG. 3(d). After rinsing and drying, the semiconductor substrate with the first cavity (112c) and the second cavity (113c) is ready for the deposition of gate metal layer.

It is thus clear that in order to form the first cavity and a second cavity to define the gate structure using the prior art method, a first photomask, a second photomask, a first resist layer and a second resist layer of a different material are needed. Furthermore, precise alignment is required when applying the first photomask and the second photomask. In order to simplify the formation process, a method using only one photomask to create the cavities can be very beneficial.

OBJECTIVES OF THE INVENTION

One object of the invention is to provide a method to form a T-gate or an inverted L-gate for semiconductor device utilizing a single photomask. Another object of the invention is to provide a method for forming a T-gate or an inverted L-gate for semiconductor devices utilizing resist layers of the same material.

DETAILED DESCRIPTION OF THE PREFERRED EMBODIMENTS

Figure 4A:
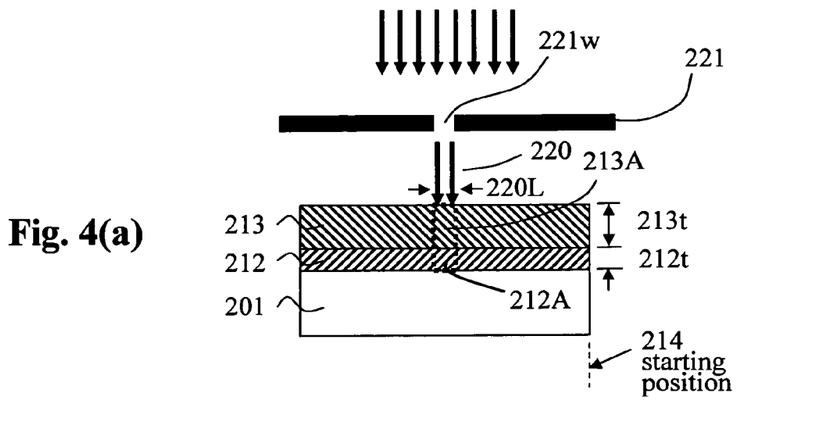
FIG. 4(a)-4(f) illustrates main processing steps in one embodiment of the present invention for the formation of cavities for a T-gate structure using a multiple-exposure patterning method with a single light beam and a single photomask.

To simplify the explanation, the channel layer as well as the source and drain are not shown in the following figures. According to one embodiment of the invention, as shown in FIG. 4(a) a semiconductor substrate (201) is coated with a first resist layer (212) having a first resist layer thickness (212t) and is baked to remove the solvent. This is followed by the coating of a second resist layer (213) having a second resist layer thickness (213t) and baking. With the right edge of the semiconductor substrate aligned to a starting position (214), a light beam (220) having a light beam length (220L) is illuminated on the second resist layer (213) and the first resist layer (212) to expose a first portion A (212A in first resist layer and 213A in second resist layer), defined by a photomask (221) with a transparent window (221w). The first exposure time, $t_1$, is controlled to be sufficiently long so that the first exposure dose in both the first portion A of the second resist layer (213A) and the first portion A of the first resist layer (212A) is sufficiently large to allow the removal of resist materials from the above portions during subsequent developing steps.

Figure 4B:
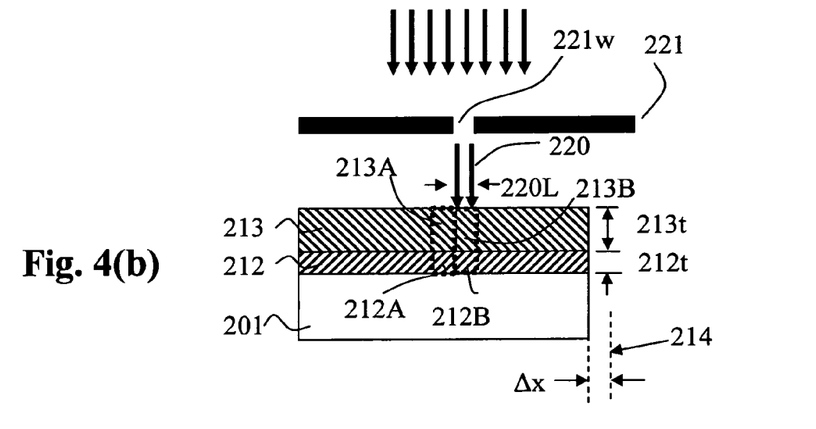
Figure 4C:
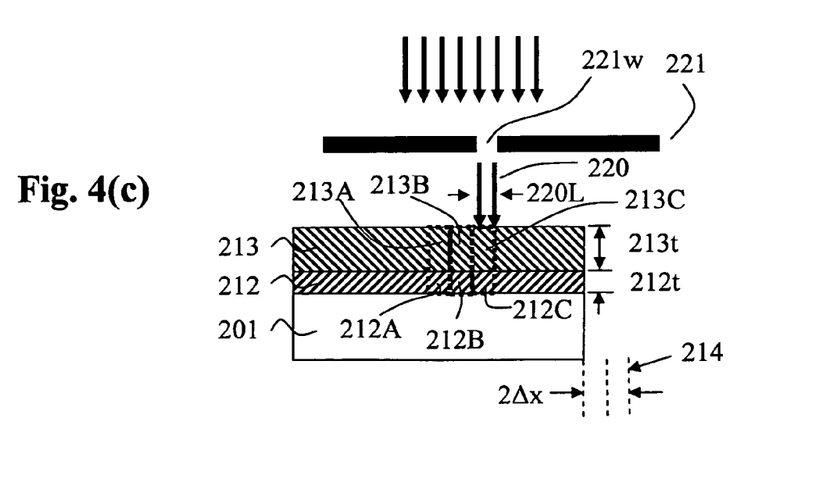

The light beam (220) is then momentarily turned off and the semiconductor substrate with the photoresist layers is moved to the left by a distance Δx from the starting position (214). The light beam (220) is then turned on to expose a second portion B (212B in first resist layer and 213B in second resist layer, see FIG. 4(b)) for a second exposure time, $t_2$. The second exposure time $t_2$ is selected to be substantially shorter than $t_1$ so that the second exposure dose in the second portion B (213B) of the second resist layer (213) is high enough to develop whereas the second exposure dose in the first portion B (212B) of the first resist layer (212) is not high enough to develop. The light beam (220) is momentarily turned off again and the semiconductor substrate is moved to the left by another distance Δx from the starting position (214). The total distance moved from the starting position (214) is now 2Δx. The light beam (220) is then turned on again to expose a third portion C (202C in first resist layer and 213C in second resist layer, see FIG. 4(c)) for a second exposure time, $t_2$. The second exposure time $t_2$ is selected to be substantially shorter than $t_1$ so that the second exposure dose in the third portion C (213C) of the second resist layer (213) is high enough to develop whereas the second exposure dose in the third portion C (212C) of the first resist layer (212) is not high enough to develop. The distance Δx is selected to be smaller than the light beam length (220L) in order to avoid forming a gap between adjacent exposure portions in the second resist layer (213). Therefore: Δx<220L.

Figure 4D:
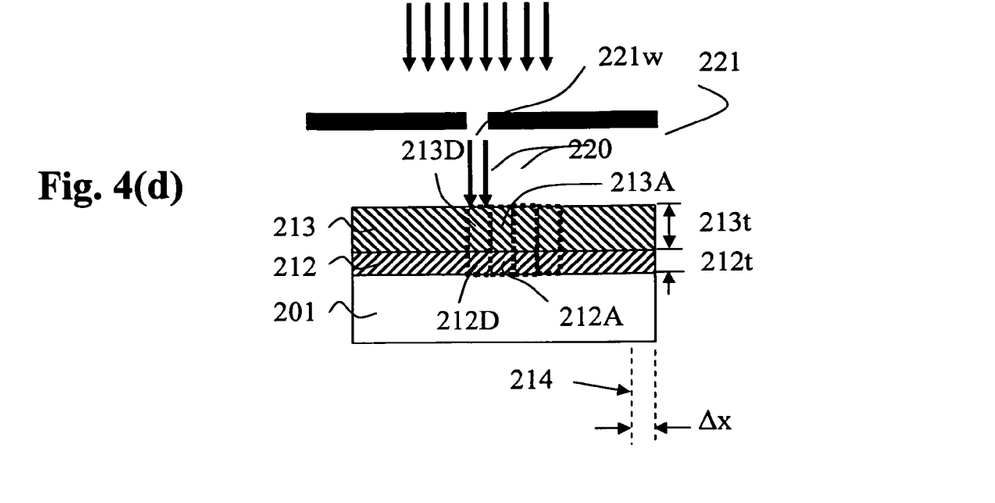
Figure 4E:
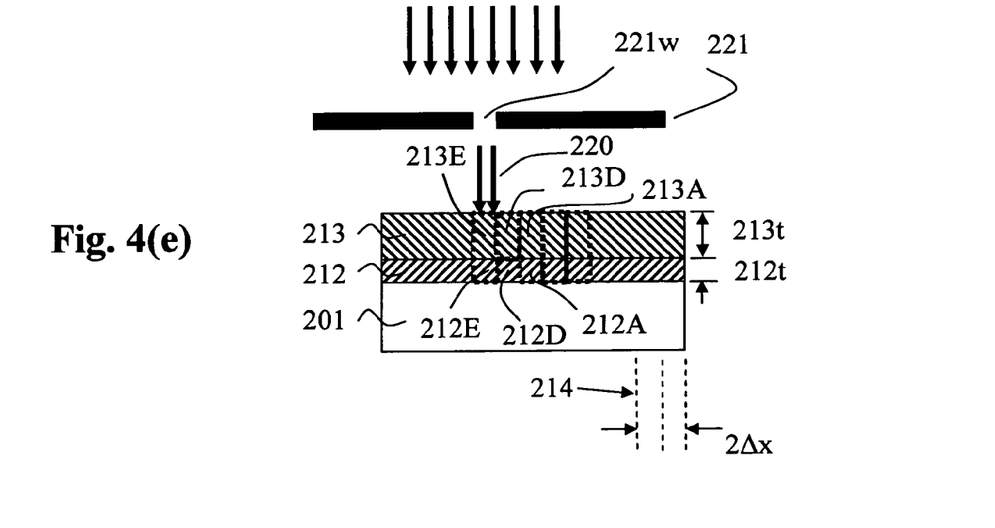

The light beam (220) is now turned off and the semiconductor substrate with the photoresist layers is moved to the right so that the right edge of the semiconductor substrate is to the right of the starting position (214) by a distance of Δx, as shown in FIG. 4(d). The light beam is then turned on to expose a fourth portion D (212D in first resist layer and 213D in second resist layer) for a second exposure time, $t_2$. The second exposure time $t_2$ again is selected to be substantially shorter than $t_1$ so that the second exposure dose in the fourth portion D (213D) of the second resist layer (213) is high enough to develop whereas the second exposure dose in the fourth portion D (212D) of the first resist layer (212) is not high enough to develop. The light beam (220) is momentarily turned off yet again and the semiconductor substrate is moved further to the right by a distance Δx so that the total distance between the semiconductor substrate right edge and the starting position (214) is 2Δx, see FIG. 4(e). The light beam is then turned on to expose a fifth portion E (212E in first resist layer and 213E in second resist layer) for a second exposure time, $t_2$. The second exposure time duration $t_2$ is again selected to be substantially shorter than the first exposure time $t_1$ so that the second exposure dose in the fifth portion E (213E) of the second resist layer (213) is high enough to develop whereas the second exposure dose in the fifth portion E (212E) of the first resist layer (212) is not high enough to develop.

Figure 4F:
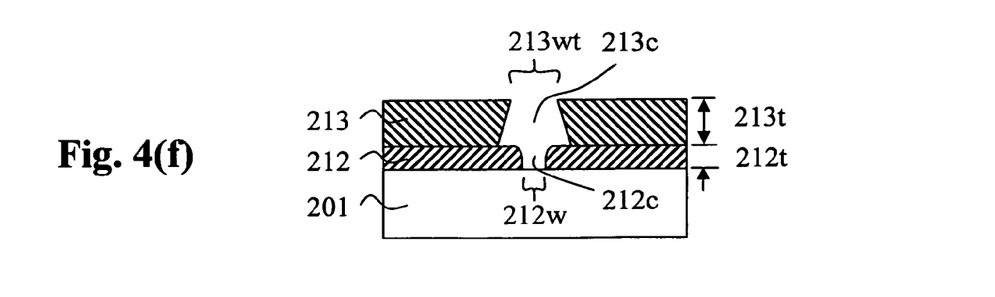

After above described multiple exposures, the second resist layer (213) on the first resist layer (212) is developed using a second developer to form a second cavity (213c) with a top width (213wt). After rinsing, the first resist layer (213) is developed using a first developer to form a first cavity (212c) with a first cavity width (212w). After rinsing and drying, the resist structure with the first cavity (212c) and the second cavity (213c), as shown in FIG. 4(f) is ready for T-gate formation. The formation of the T-gate is achieved by vacuum deposition of metal multiple layer followed by a lift-off process. The vacuum deposition of metal multiple layer and subsequent lift-off process are relatively standard to those skilled in the arts and will not be described further here.

The light beam (220) in FIG. 4(a)-4(e) may be obtained from an optical stepper using a single photomask or an optical scanner. It is preferable to use an optical stepper due to the high throughputs requirement. For an optical stepper, the photomask used is often fixed in position whereas the position of the stage with the semiconductor substrate mounted on is adjustable. An optical beam is formed through projection of a pattern or opening in the mask onto the semiconductor substrate.

Figure 4G:
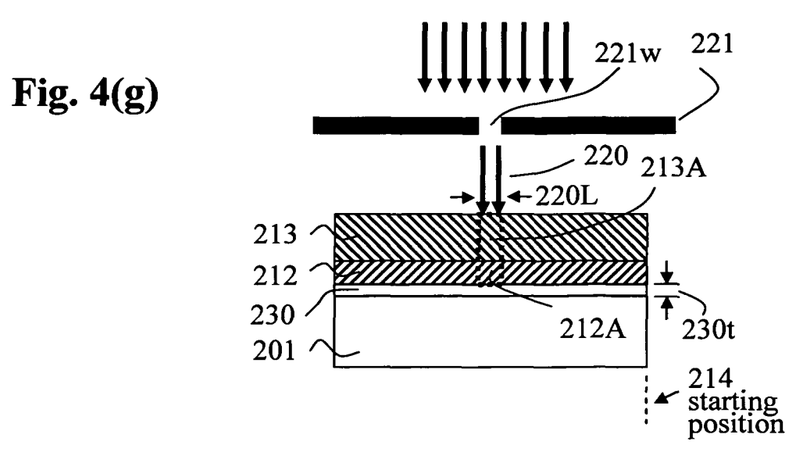
FIG. 4(g) shows the substrate (201) in FIG. 4(a) with an antireflection layer or an attenuating layer (230) added between the semiconductor substrate (201) and the first resist layer (212) to reduce reflection of the light from the substrate.

In order to minimize the un-wanted reflection of light from the substrate, an anti-reflection layer or attenuator layer (230 in FIG. 4(g)) is preferably deposited on said semiconductor substrate (201) before the deposition of the first resist layer. The attenuator thickness (230t) is selected to be substantially equal to one quarter of wavelength of the light traveling in said attenuator layer to minimize the unwanted reflection.

Figure 5A:
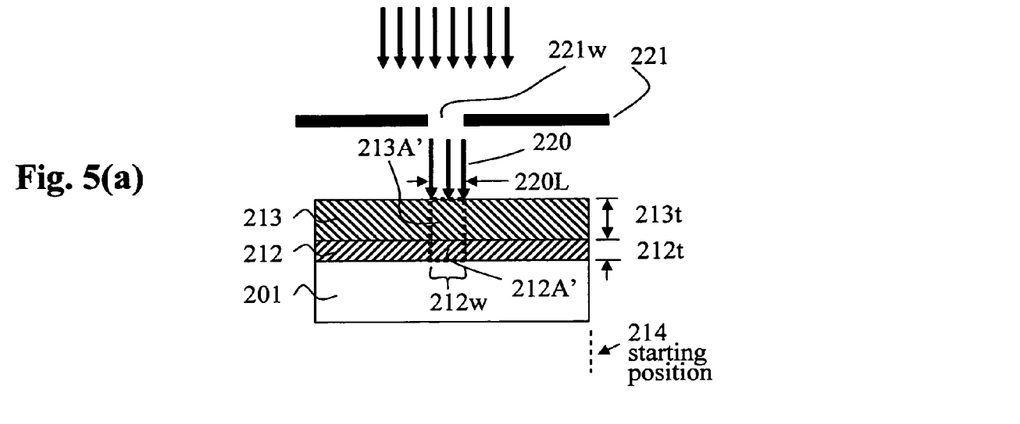
FIGS. 5(a) and 5(b) illustrates a multiple-exposure patterning method with a single light beam and a single mask for the formation of cavities for a T-gate structure, while 5(c) shows the enlarged substrate in FIG. 5(b) for demonstration purpose.
Figure 5B:
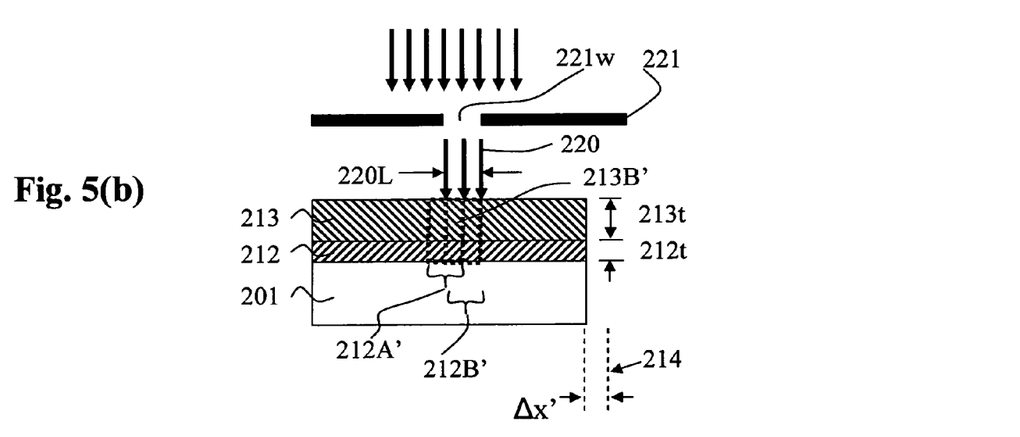

According to another embodiment of this invention, a multiple-exposure patterning method wherein the distance of movement between adjacent exposure areas is selected to be substantially smaller compared to the light beam length. As shown in FIG. 5(a), the right edge of the semiconductor substrate (201) is first aligned to the starting position (214). After a first exposure for a first exposure time of $t_1$, a first exposure dose is achieved in first portion A' (213A' in second resist layer and 212A' in first resist layer), with a width (212w). The first exposure time, $t_1$, is selected to be sufficiently long so that the first exposure dose in both the first portion A' of the second resist layer and the first portion A' of the first resist layer is sufficiently large to allow the removal of resist materials from the above portions during subsequent developing steps. After this, the light source (220) of length (220L) is momentarily turned off and the semiconductor substrate (201) is moved to the left by a distance Δx', as shown in FIG. 5(b). The light source (220) is then turned on again for a second exposure time, $t_2$, to provide a second exposure dose in the second portion B' (212B' in the first resist layer and 213B' in the second resist layer).

Figure 5C:
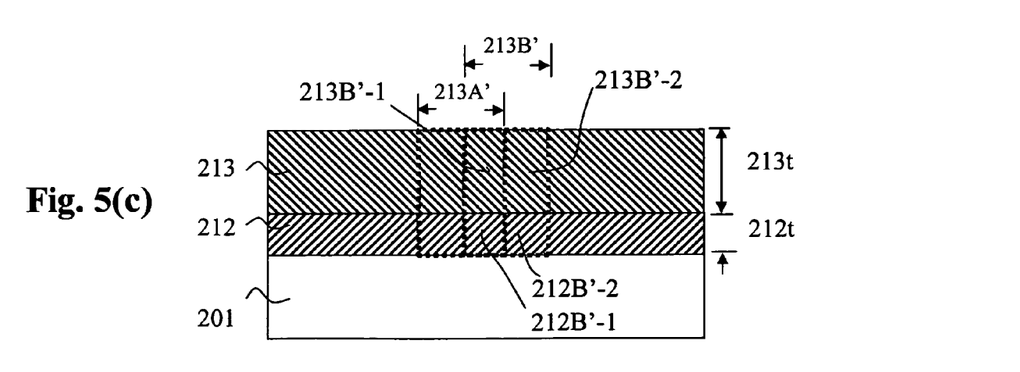

As shown in FIG. 5(c), which is an enlarged illustration of substrate (201) in FIG. 5(b), the second portion (213B') of second resist layer (213) has a left section (213B'-1) and a right section (213B'-2). The left section (213B'-1) overlaps part of the first portion (213A') of the second resist layer (213). Similarly, the second portion (212B') of the first resist layer (212) has a left section (212B'-1) and a right section (212B'-2). The left section (212B'-1) overlaps part of the first portion (212A') of the first resist layer (212). The second exposure time $t_2$ is selected so that the second exposure dose in the right section (213B'-2) exceeds sensitivity of the second resist layer (213), whereas the second exposure dose in the right section (212B'-2) is below sensitivity of the first resist layer (212).

Figure 6A:
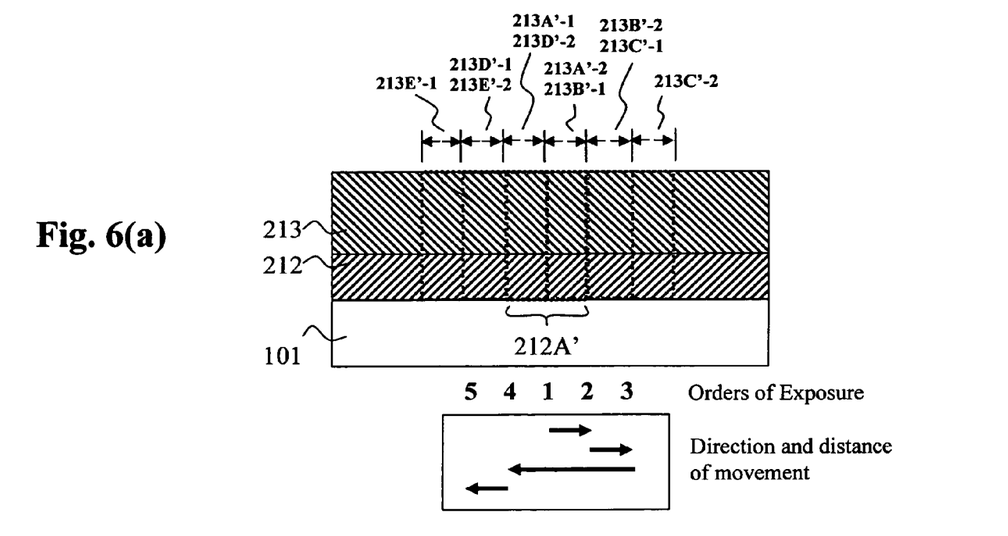
FIG. 6(a) illustrates a multiple-exposure patterning method according to another embodiment of the invention.

The multiple-exposure patterning method with the reduced distance or movement between adjacent exposure portions can be advantageously used to generate reentrant or overhang in the top portion of the second resist layer (213). This feature is graphically depicted in FIG. 6. In FIG. 6(a), the horizontal arrows below the semiconductor substrate indicate the direction and distance of movement after each exposure whereas the numerals 1, 2, 3, 4 and 5 indicate the order of exposures for portions A', B', C', D' and E'. With a total number of five exposures in portions A', B', C', D' and E', the exposed second resist (213) can be divided into six sections: (213E'-1), (213D'-1 or 213E'-2), (213A'-1 or 213D'-2), (213A'-2 or 213B'-1), (213B'-2 or 213C'-1), and 213C'-2. The first exposure time, $t_1$, for the first exposure in portion A' or in the sections 213A'-1 and 213A'-2 is selected to be substantially larger or longer than the second exposure time $t_2$ for each of the following 4 exposures in portions B', C', D', E' or in sections: (213E'-1 and 213E'-2), (213D'-1 and 213D'-2), (213B'-1 and 213B'-2), and (213C'-1 and 213C'-2). Similarly, with a total number of five exposures in portions A', B', C', D' and E', the exposed first resist (212) can be divided into six sections: (212E'-1), (212D'-1 or 212E'-2), (212A'-1 or 212D'-2), (212A'-2 or 212B'-1), (212B'-2 or 212C'-1), and 212C'-2. The distribution of accumulative doses received by the second resist layer (213) and the first resist layer (212) is given in FIGS. 6(b) and 6(c) respectively.

Figure 6B:
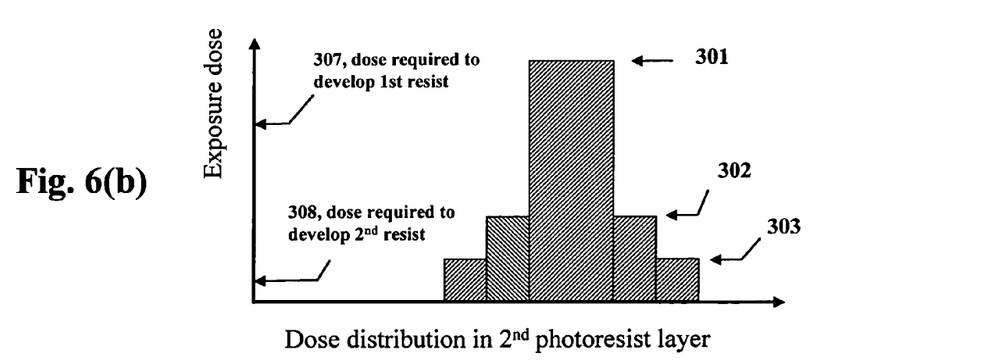
FIG. 6(b) shows the exposure dose received by the second resist layer and 6(c) shows the dose distribution in the first resist layer.
Figure 6C:
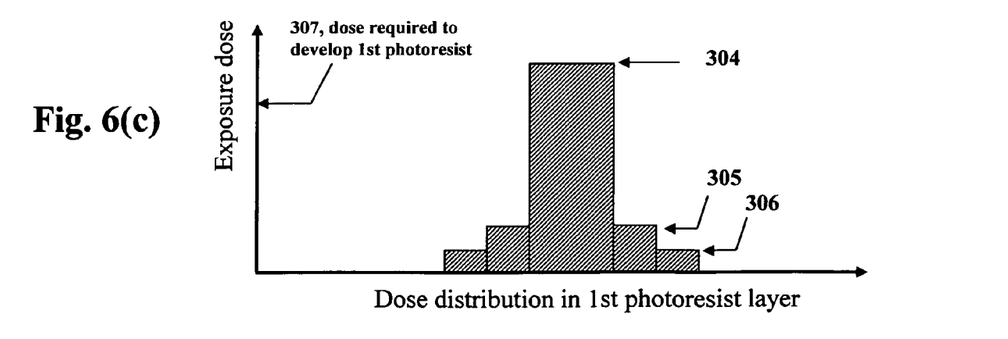
Figure 6D:
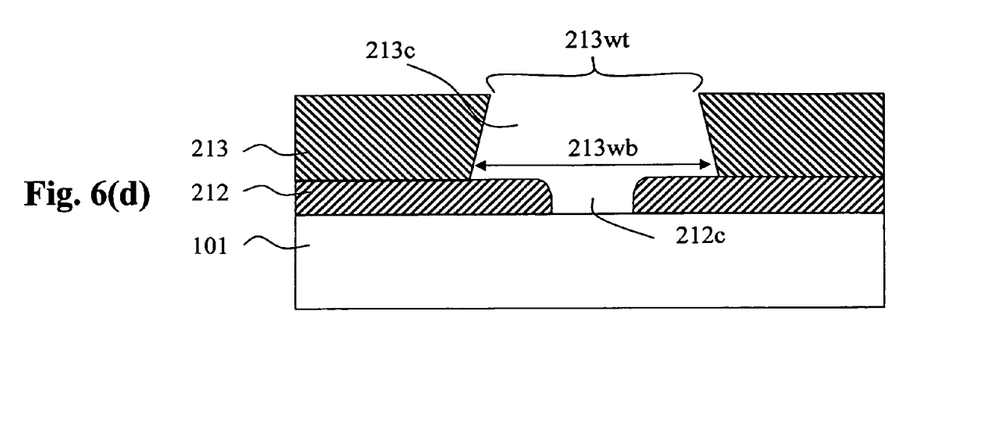
FIG. 6(d) illustrates the cross-section of the substrate with the two cavities (212c, 213c).

As shown in FIG. 6(b), in second resist (213) a high dose (301) is achieved in the central sections (213A'-1 or 213D'-2) and (213A'-2 or 213B'-1) mainly due to the long first exposure time $t_1$ in portion A'. In the two outermost sections (213E'-1) and (213C'-2), a low dose (303) is caused by a single exposure at a shorter second exposure time $t_2$. Whereas in the intermediate sections (213D'-1 or 213E'-2) and (213B'-2 or 213C'-1), intermediate dose (302) is present owing to a double-exposure at the second exposure time $t_2$. It is noted that the two outermost sections (213E'-1 and 213C'-2) with low dose are adjacent to the un-exposed second resist layer (213). In the same way, in the first resist (212) a high dose (304) is achieved in the central sections (212A'-1 or 212D'-2) and (212A'-2 or 212B'-1) as the result of a long first exposure time $t_1$ in portion A'. In the two outermost sections (212E'-1) and (212C'-2), a low dose (306) is achieved in the first resist layer (212) due to the short second exposure time $t_2$. And finally, an intermediate dose (305) is the outcome of double exposure at the second exposure time $t_2$ in the intermediate sections (212D'-1 or 212E'-2) and (212B'-2 or 212C'-1). In FIG. 6(b) and FIG. 6(c), the dose level (307) which is the minimum dose required for developing the first resist layer (212) is indicated on the y-axis. In FIG. 6(b) the required dose level (308) for the development of the second resist layer (213) is also marked. The high dose (301), the intermediate dose (302) and the low dose (303) in the second resist layer (213) all exceed the dose level (308) which is required to develop the second resist layer (213), then a second cavity (213c, FIG. 6(d)) with a top width (213wt) and bottom width (213wb) can be formed after developing the second resist layer (213). As shown in FIG. 6(c), the dose level (307) required to develop first resist layer (212) is less than the high dose (304) value and greater than the intermediate dose (305) value and the low dose (306) in the first resist (212), so that a first cavity (212c in FIG. 6(d)) will be formed after the developing of the first resist layer (212). Thus, by selecting carefully the materials of the first resist and the second resist as well as the first exposure time $t_1$ and the second exposure time $t_2$ to achieve a dose distribution and dose level for developing as shown in FIGS. 6(b) and 6(c), a cavity suitable for the deposition of a T-gate structure (as shown in FIG. 6(d)) can be formed by using a single photomask and multiple-exposure method.

Figure 7A:
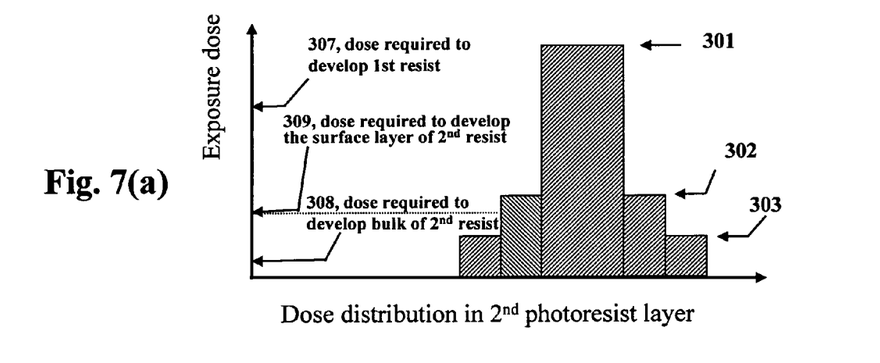
FIG. 7(a) shows the exposure dose received by the second resist layer from a multiple-exposure process illustrated in FIG. 6(a), where an increased dose level (309) for developing the top layer of the second resist is indicated.
Figure 7B:
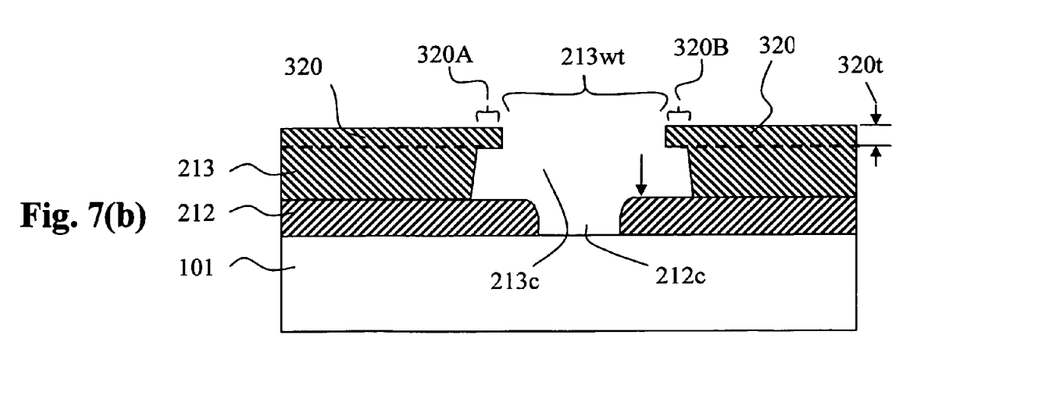
FIG. 7(b) is a schematic diagram illustrates cross-section of cavities with overhung using the multiple-patterning method shown in FIG. 6 (a) but with an increased development dose level (309), to facilitate lift-off.

As shown in FIGS. 7(a) and 7(b), in yet another embodiment, a required exposure dose level (309, FIG. 7(a)) to develop the top or surface layer (320, FIG. 7(b)) of the second resist layer (213) is increased from the dose level (308) for the bulk of the second resist layer to a new value which is larger than the low dose level (303) and less than the intermediate dose level (302). Therefore, after developing of the second resist layer (213), portions of second resist surface layer (320A, 320B) of thickness (320t) do not dissolve. These portions of second resist surface layer form reentrant or overhang structures (320A and 320B) for the second cavity (213c) to facilitate lift-off process after deposition of gate metals.

The second resist surface layer (320) with an increased required exposure dose level for development may be formed by carrying out a plasma treatment to in-sensitize a surface layer (320) of the second resist layer (213). This can also be achieved by a chemical treatment. Alternately, the second resist surface layer (320) may be formed by applying a new resist layer having a lower sensitivity and a higher dose level required to develop.

Figure 8A:
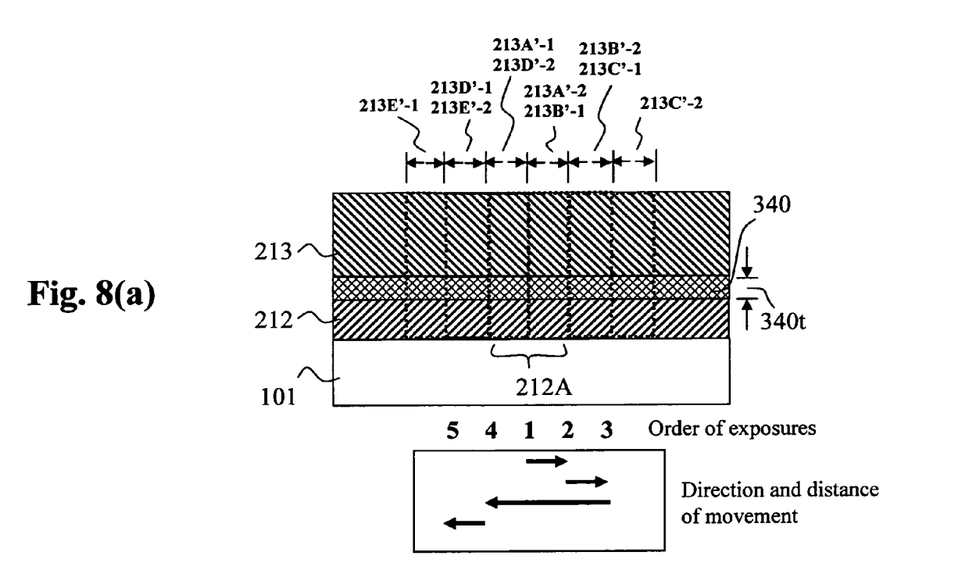
FIG. 8(a) illustrates cross-sectional view of a substrate with an attenuator layer deposited between the first resist layer and the second resist layer according to yet another embodiment of the multiple-exposure patterning method, and 8(b) shows reduced dose distribution in the first resist layer.
Figure 8B:
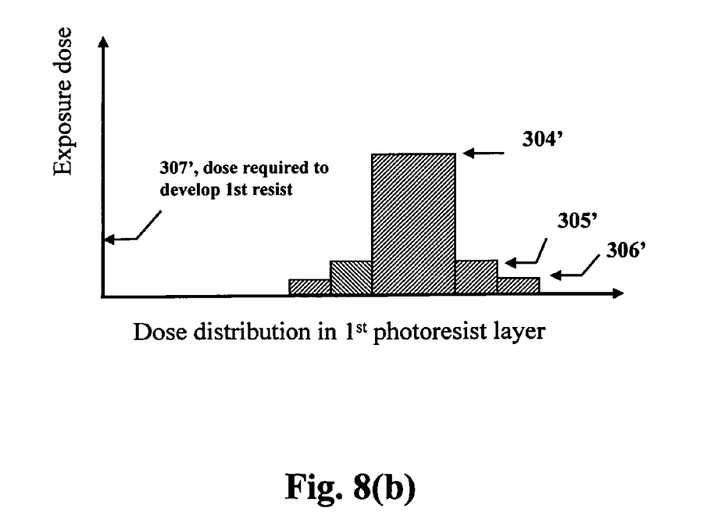

In the event that the first resist layer (212) is too sensitive so that the exposure dose (307') required to develop it is smaller than the intermediate dose level (305, FIG. 6(c)) and in certain cases even smaller than the low dose level (306, FIG. 6(c)), the multiple-exposure patterning method described above may not yield proper a first cavity (212c) and a second cavity (213c) suitable for T-gate formation. According to yet another embodiment of the invention, an attenuator layer (340) is inserted between the first resist layer (212) and the second resist layer (213). The attenuator layer (340) has an attenuator layer thickness (340t) and reduced transmission so that after the multiple exposures, the dose distribution in the first resist layer (212) will be given in FIG. 8 (b). Here in the first resist layer (212), the value of the high dose (304'), intermediate dose (305') and the low dose (306') have been reduced substantially (from 304, 305 and 306 in FIG. 6(c)) so that the dose (307') required to develop first resist layer (212) is much larger than the intermediate dose (305') and low dose (306'). After developing of the second resist layer (213), a second cavity (213c) will form to expose portion of the attenuator layer (340). The exposed portion of the attenuator (340) is removed by etching in an etching solution to expose the first resist layer (212). After developing of the first resist layer, a well defined first cavity (212c) will form.

According to still another embodiment of this invention, as a consequence of the use of the attenuator layer (340), material for the first resist layer (212) and material for the second resist layer (213) can be selected to be the same and separated by the attenuator layer (340). The attenuator layer thickness (340t) is selected so that the exposure dose received by the first resist layer (212) during exposure at a first exposure time $t_1$ is substantially less compared to dose required developing the second resist layer (213).

What is claimed is:

1. A multiple-exposure patterning method using a single photomask for forming a T-gate or inverted L-gate structure for an electronic device and a circuit, comprising:
    a) providing a semiconductor substrate having a semiconductor layer structure,
    b) depositing a first resist layer having a first thickness and a first minimum development dosing requirement on said semiconductor substrate,
    c) depositing a second resist layer having a second thickness and a second minimum development dosing requirement on said first resist layer, thereby forming a dual resist layer,
    d) providing a single photomask having a transparent window, said transparent window being aligned to a first region on a surface of said second resist layer,
    e) providing a light beam having a length and a width to said first region, said length and width being defined by said transparent window of said photomask, to a region on the surface of said second resist layer;
    f) first exposing a first portion of said dual resist layer by shining said light beam on said first region of said second resist layer surface to achieve a first exposure dose in said first portion of said dual resist layer to define a first cavity in the first resist layer for a stem portion of said gate structure, wherein said first exposure dose exceeds the first and the second minimum development dosing requirements;
    g) then shifting said semiconductor substrate by a distance not greater than said beam length so that said photomask window and said light beam are aligned to a second region on said second resist layer surface, exposing a second portion of said dual resist layer by shining said light beam on said second region of said second resist layer surface at a second exposure dose, wherein said second exposure dose exceeds said second minimum development dosing requirement and is below said first minimum development dosing requirement,
    h) aligning and exposing a plurality of second portions of said dual resist layer at the second exposure dose by repeating step g) in a successive manner on said second resist layer to define a second cavity for a head portion of said gate structure,
    i) developing the dual resist layer in a second developer to remove second resist material from said exposed plurality of portions of said second resist layer and to form said second cavity,
    j) developing the dual resist layer in a first developer to remove first resist material from said first portion of said first resist layer and to form said first cavity,
    k) depositing gate metal layers in the first and second cavities to form said gate structure, and
    l) carrying out a liftoff process to further form said gate structure.

2. A multiple-exposure patterning method for forming a T-gate or inverted L-gate structure as defined in claim 1, wherein said light beam is derived from an optical stepper with a single photomask, said length and width of said light beam is defined by an opening or a transparent region of said photomask.

3. A multiple-exposure patterning method for forming a T-gate or inverted L-gate structure as defined in claim 1, wherein said light beam is derived from an optical scanner.

4. A multiple-exposure patterning method for forming a T-gate or inverted L-gate structure as defined in claim 1, wherein materials of said first resist layer and said second resist layer are selected so that said first minimum development dosing requirement is at least two times of said second minimum dosing requirement.

5. A multiple-exposure patterning method for forming a T-gate or inverted L-gate structure as defined in claim 1, wherein said shifting distance between two adjacent portions of said plurality of portions is not greater than half of said light beam length.

6. A multiple-exposure patterning method for forming a T-gate or inverted L-gate structure as defined in claim 1, further comprising a step of forming an anti-reflecting layer between said semiconductor substrate and said first resist layer to reduce reflection of said light beam from surface of said semiconductor substrate.

7. A multiple-exposure patterning method for forming a T-gate or inverted L-gate structure as defined in claim 1, further comprising a step of increasing the second minimum development dosing requirement, in order to create overhang to facilitate the lift-off process for forming said gate structure.

8. A multiple-exposure patterning method for forming a T-gate or inverted L-gate structure as defined in claim 1, further comprising a step of depositing a third resist layer on said second resist layer, dose required to develop said third resist layer is selected to be at least two times of dose required to develop said second layer, in order to create overhang to facilitate a lift-off process for creation of said gate structure.

9. A multiple-exposure patterning method for forming a T-gate or inverted L-gate structure as defined in claim 1, further comprising a step of depositing an attenuator layer between said first resist layer and said second resist layer to reduce exposure dose received by said first resist layer, said attenuator layer is removed after developing of said second resist layer.

10. A multiple exposure pattering method using a single photomask for forming a T-gate or inverted L-gate for an electronic device and a circuit, comprising:
  a) providing a semiconductor substrate having a semiconductor layer structure,
  b) depositing a first resist layer on said semiconductor substrate having a first minimum development dosing requirement,
  c) depositing an attenuator layer on said first resist layer,
  d) depositing a second resist layer on said attenuator layer having a second minimum development dosing requirement, thereby forming a sandwich layer structure,
  e) providing a single photomask having a transparent window, said transparent window is aligned to a first region on surface of said second resist layer for said gate structure,
  f) providing a light beam having a length and a width to said first region, said length and width being defined by said transparent window of said photomask,
  g) first exposing a first portion of said sandwich layer structure by shining said light beam on said first region of said second resist layer surface to achieve a first exposure dose in said first portion of said sandwich layer structure to define a first cavity for a stem portion of said gate structure, wherein said first exposure dose exceeds said first minimum development dosing requirement and said second minimum development dosing requirement;
  h) then shifting said semiconductor substrate by a distance not greater than said beam length so that said photomask window and said light beam are aligned to a second region on said second resist layer surface, exposing a second portion of said sandwich layer structure by shining said light beam on said second region of said second resist layer surface at a second exposure dose, wherein said second exposure dose exceeds said second minimum development dosing requirement;
  i) exposing a plurality of second portions of said sandwich layer structure at a second dose by repeating step h) in a successive manner to define a second cavity for a head portion of said gate structure,
  j) developing the sandwich layer structure in a second developer to remove second resist material from said exposed plurality of portions of second resist layer and to form said second cavity,
  k) etching the sandwich layer structure in a solution to remove exposed attenuator layer,
  l) developing the sandwich layer structure in a first developer to remove first resist material from said first portion of said first resist layer and to form said first cavity,
  m) depositing gate metal layers in the first and second cavity to form said gate structure, and
  n) carrying out a lift-off process to further form said gate structure.

11. A multiple-exposure patterning method for forming a T-gate or inverted L-gate structure as defined in claim 10, wherein said light beam is derived from an optical stepper with a single photomask, said length and width of said light beam is defined by an opening or a transparent region of said photomask.

12. A multiple-exposure patterning method for forming a T-gate or inverted L-gate structure as defined in claim 10, wherein said light beam is derived from an optical scanner.

13. A multiple-exposure patterning method for forming a T-gate or inverted L-gate structure as defined in claim 10, wherein material for said first resist layer and said second resist layer is selected to be the same and said attenuator layer reduce said exposure dose achieved in said first resist layer.

14. A multiple-exposure patterning method for forming a T-gate or inverted L-gate structure as defined in claim 10, wherein material for said first resist layer is different from material for said second resist layer and said attenuator layer reduce said exposure dose achieved in said first resist layer.

15. A multiple-exposure patterning method for forming a T-gate or inverted L-gate structure as defined in claim 10, wherein distance between two adjacent portions of said plurality of portions is not greater than half of said light beam length.

16. A multiple-exposure patterning method for forming a T-gate or inverted L-gate structure as defined in claim 10, further comprising a step of forming an anti-reflecting layer between said semiconductor substrate and said first resist layer to reduce reflection of said light beam from surface of said semiconductor substrate.

17. A multiple-exposure patterning method for forming a for forming a T-gate or inverted L-gate structure as defined in claim 10, further comprising a step of increasing the second minimum development dosing requirement, in order to create overhang to facilitate the lift-off process to form said gate structure.

18. A multiple-exposure patterning method for forming a T-gate or inverted L-gate structure as described in claim 10, further comprising a step of depositing a third resist layer on said second resist layer, the third resist layer having a third minimum development dosing requirement which is selected to be substantially greater than the second minimum dosing requirement, in order to create overhang to facilitate the lift-off process to form said gate structure.

19. A multiple-exposure patterning method for forming a T-gate or inverted L-gate structure as defined in claim 10, wherein said attenuator layer is deposited by a method selected from a group of spin-coating, spray coating and vacuum deposition.

* * * * *